(12) United States Patent
Kor

(10) Patent No.: US 6,538,637 B1
(45) Date of Patent: Mar. 25, 2003

(54) INTRINSIC CONSOLE WITH POSITIONABLE PROGRAMMABLE MULTI-FUNCTION MULTI-POSITION CONTROLLERS

(75) Inventor: Bouko James Kor, Manitoba (CA)

(73) Assignee: Canadian Space Agency, Saint-Hubert (CA)

( * ) Notice: Subject to any disclaimer, the term of this patent is extended or adjusted under 35 U.S.C. 154(b) by 0 days.

(21) Appl. No.: 09/425,046

(22) Filed: Oct. 22, 1999

(65) Prior Publication Data (65)

Related U.S. Application Data

(60) Provisional application No. 60/105,207, filed on Oct. 22, 1998.

(51) Int. Cl.[7] .................................................. G09G 5/00
(52) U.S. Cl. ............................ 345/156; 463/36; 463/37
(58) Field of Search ................................ 361/680, 686; 180/170–174; 200/21.89, 5 R, 5 A, 5 B, 5 C; 348/734; 345/156–169; 463/37–38; 233/148 B; 340/825.72

(56) References Cited

U.S. PATENT DOCUMENTS

| | | | | |
|---|---|---|---|---|
| 4,999,622 A | * | 3/1991 | Amano et al. .......... 340/825.72 |
| 5,493,618 A | * | 2/1996 | Stevens et al. ............. 381/110 |
| 5,831,555 A | * | 11/1998 | Yu et al. ........................ 341/26 |
| 5,898,386 A | * | 4/1999 | Kaihatsu ................ 340/825.69 |
| 5,949,401 A | * | 9/1999 | Kazarian ..................... 345/156 |
| 6,127,961 A | * | 10/2000 | Stacy et al. .................. 341/176 |
| 6,256,011 B1 | * | 7/2001 | Culver ......................... 345/157 |
| 6,396,549 B1 | * | 5/2002 | Weber ......................... 348/734 |

* cited by examiner

Primary Examiner—Lun-Yi Lao
(74) Attorney, Agent, or Firm—Freedman & Associates

(57) ABSTRACT

An intrinsic console, moveable with respect to a base between at least two locations, has one or more controllers (sliders, switches, joysticks). Typically a controller controls different devices in different locations (multi-function). The controller has at least two positions in each location, but may have different settings (slider, two-position switch—momentary or ON/OFF—three-position switch, etc.). The locations, functions, positions, and settings are microprocessor controlled, and reprogrammable. LED or LCD indicator displays can be incorporated with the controller, and similarly change with location. This reduces the absolute number of controllers necessary. The positions of levers and joysticks are digitally measured by optical emitters and detectors which pass light through apertures of known location, these measurements may be relative or absolute. The console is ideally pivotally mounted near the elbow of a vehicle or equipment operator.

20 Claims, 9 Drawing Sheets

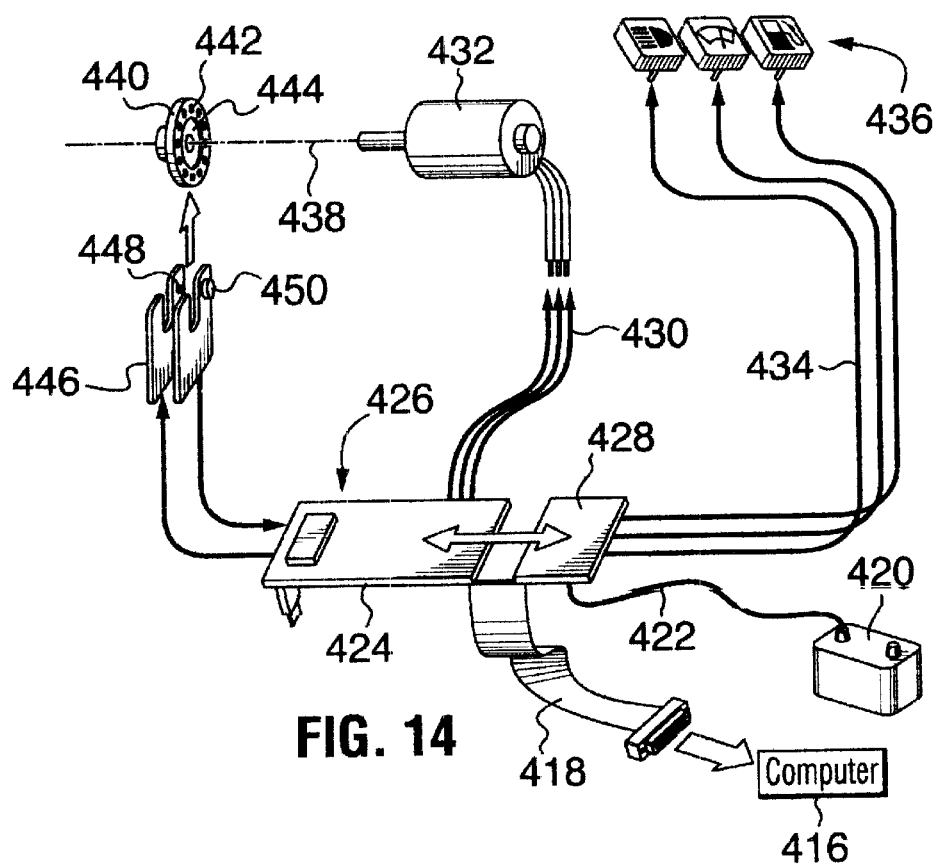
FIG. 14
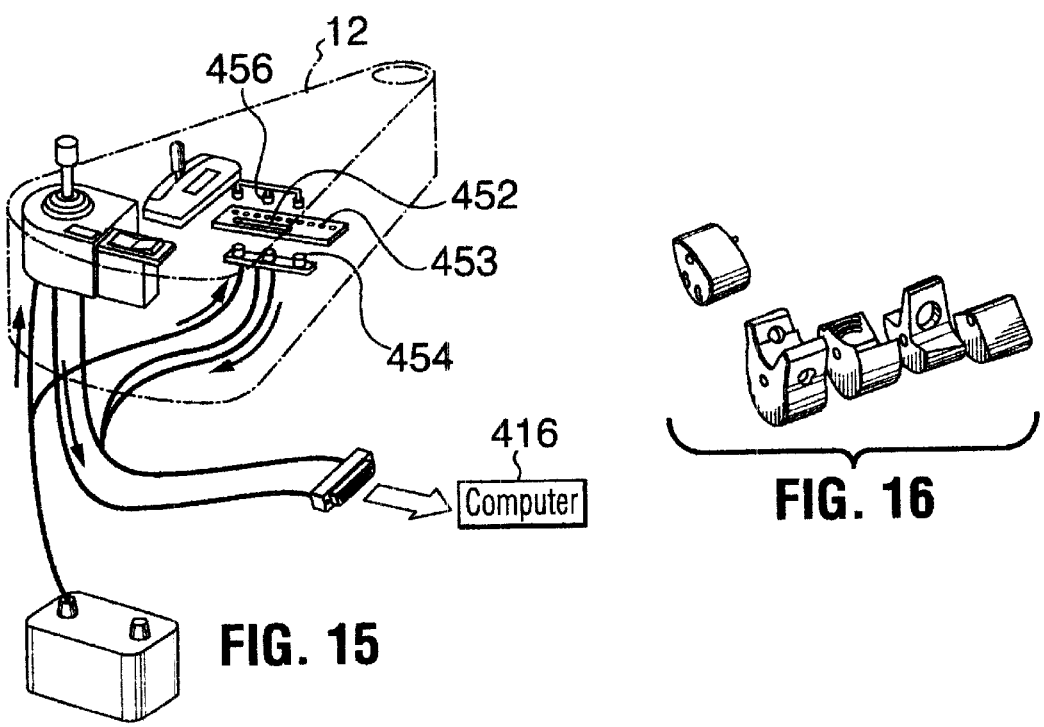
FIG. 15
FIG. 16

INTRINSIC CONSOLE WITH POSITIONABLE PROGRAMMABLE MULTI-FUNCTION MULTI-POSITION CONTROLLERS

This application claims priority of U.S. provisional patent application Ser. No. 60/105,207, filed on Oct. 22, 1998.

This invention relates to an intrinsic console and related controllers. An intrinsic console is the name for a control console, movable by the operator between two or more distinct locations, having at least one controller controlling a different device in each distinct location. The controller controls the device by the position of the controller's bat, knob, grip, lever, slider, joystick or the like. When controller's location is changed, the controlled devices are still controlled, but to change the position controlling for a specific device, the controller has to be in a specific location. As the controller is moved from one location to another, the position of the controller in the second location will be that position set in that location (which may be the same as in the first location or different). The console has location sensors which monitor the location of the console and thus the controller. Although the controller(s) may be on-off, or momentary, it is preferred that they be programmable multi-position controllers, which may have several positions (such as a gearbox) or be continuous (such as a dimmer or steering wheel). The controller is positionable, that is a microprocessor can move the controller bat, knob, grip, lever, slider or joystick to any position. So when the operator changes the location of the controller, monitored by the location sensor, a microprocessor remembers the position of the controller in that location, monitors the position by a position sensor, and without operator action moves the controller's bat, knob, grip, lever, slider, or joystick to that position. The controllers include, but are not limited to, momentary, two- and three-position switches, rotary switches, slider controllers (one-degree-of-freedom controllers), joysticks (two-degree-of-freedom controllers). The controllers designed for use with the intrinsic console are preferably programmable as to their mode of control, and this programming is intended to be changeable by the operator. It is expected that manufacturers using the controllers may restrict the degree of programming for safety and other operational reasons.

Although the invention is described and referred to specifically as it relates to specific components, devices and structures for intrinsic consoles and related programmable positionable multi-function multi-position controllers it will be understood that the principles of this invention are equally applicable to similar components, devices, structures and accordingly, it will be understood that the invention is not limited to such components, devices, and structures for intrinsic consoles and related programmable multi-function multi-position controllers.

In this application the term "location" defines a specific physical location or position of a controller, the term "position" defines a specific state of the controller, for instance ON or OFF. "Setting" defines the specific way the controller works (momentary switch, position switch, rotary switch, slider controller, joystick and the like). "Positionable" means the controller "position" can be changed by a microprocessor. "Programmable" means the microprocessor can change the controllers "setting" and device controlled.

PRIOR ART

Applicant is not aware any prior art devices.

The invention followed two lines of development. The intrinsic console, where a controller controlled several functional devices, and its position changed according to location, that is the changing the position of the controller for a specific device can only be done in a specific location. If a controller has a specific position in a specific location, then moving the controller to a different location will not change the effect of that position. A controller may have different positions in different locations. For example it may be ON in a first location and OFF in a second location, when the switch is moved from first to second location it will change its setting from ON to OFF as it does so.

The programmable multi-function multi-position switch or controller was developed separately. This allows one controller to have several different functions, each of which may have a different group of possible controller positions.

It is a principal object of the invention to provide an intrinsic console having at least one controller, which controls at least two devices, where the specific position of the controller for a specific device can only be changed in a specific location, other positions of the controller remaining unchanged. It is a further principal object of the invention to provide a multi-functional multi-position switch, each function having an associated group of positions which may differ from the positions of other functions. It is a subsidiary object of the invention to provide a digital position measuring system for the drive motor(s). It is a further subsidiary object that the position measuring system comprises an optical quadrature aperture counting system. It is a further subsidiary object that the position measuring system comprises a motor commutation slot counting system. Other objects will be apparent to those skilled in the art from the following specification, statement of invention claimed and accompanying drawings.

DESCRIPTION OF THE INVENTION

In one broad aspect the invention is directed to an intrinsic console mounted on a base and movable between at least two distinct locations. The console has mounted thereon at least one controller having at least two distinct positions. The controller controls different devices in different locations. Preferably the controller's position is controlled by microprocessor. Typically console location and control position are monitored by sensors. Conveniently the controller has a display indicating device controlled and controller position according to controller position and console location, this display is microprocessor controlled. The controller may have a different number of control positions in different locations. The controller is usually selected from toggle switch, slider, rotary switch, and joystick. The relative position of the console may be determined by digital optical detectors receiving radiation from electromagnetic emitters passed through an apertured optical positioning member.

In another broad aspect the invention is directed to a controller for a device having a lever and a microprocessor controlling a motor and the number of positions of the lever. Typically the lever positions are monitored by sensors. The lever may operate as slider, or toggle switch, which may have a plurality of distinct position settings, each position setting having at least two toggle positions. The lever is selected by the microprocessor to function as either slider or toggle switch, when the toggle switch is selected, a position setting is selected from a plurality of distinct position settings, each position setting having at least two toggle positions. The relative position of the controller may be determined by digital optical detectors receiving radiation from electromagnetic emitters passed through an apertured optical positioning member. The absolute position of the controller may be determined by digital optical detectors receiving radiation from electromagnetic emitters passed through commutation slots.

In a third broad aspect the invention is directed to a controller for a device having a microprocessor controlled motor driving a gear train pivoting a control element, which may be a pivotable toggle having at least two control positions, or a pivotable slider lever. The controller may have two microprocessor controlled motors drive separate gear trains pivoting a control element, each motor and gear train moving the same control element in one of two perpendicular dimensions. The controller may be a joystick, wherein the position of the joystick handle is separately determined for each perpendicular dimension is determined by digital optical detectors receiving radiation from electromagnetic emitters passed through an apertured optical positioning member.

The invention is illustrated but not restricted by the foregoing description.

BRIEF DESCRIPTION OF THE DRAWINGS

FIG. 14 shows a perspective view of a control circuit for a slider, toggle or one joystick motor.

FIG. 15 shows a perspective view of a control circuit for armrest position.

FIG. 16 shows various toggle rockers of the invention.

DESCRIPTION OF THE PREFERRED EMBODIMENTS

Figure 1:
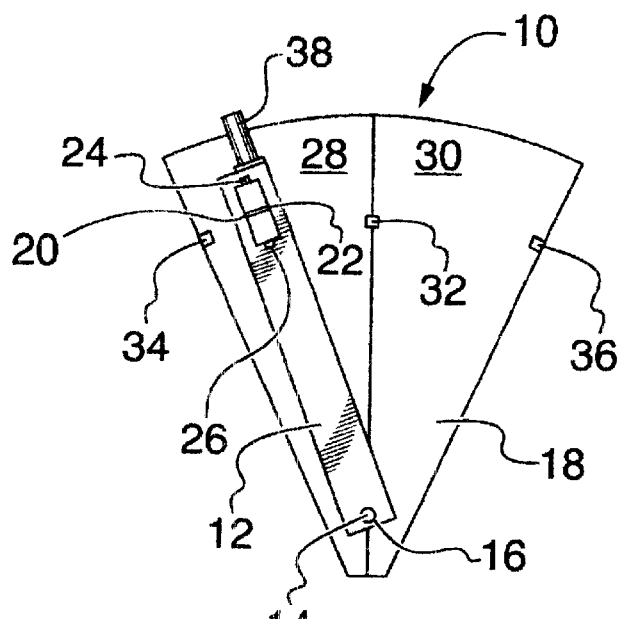
FIG. 1 is a top plan view of an embodiment of the intrinsic console of the invention.
Figure 2:
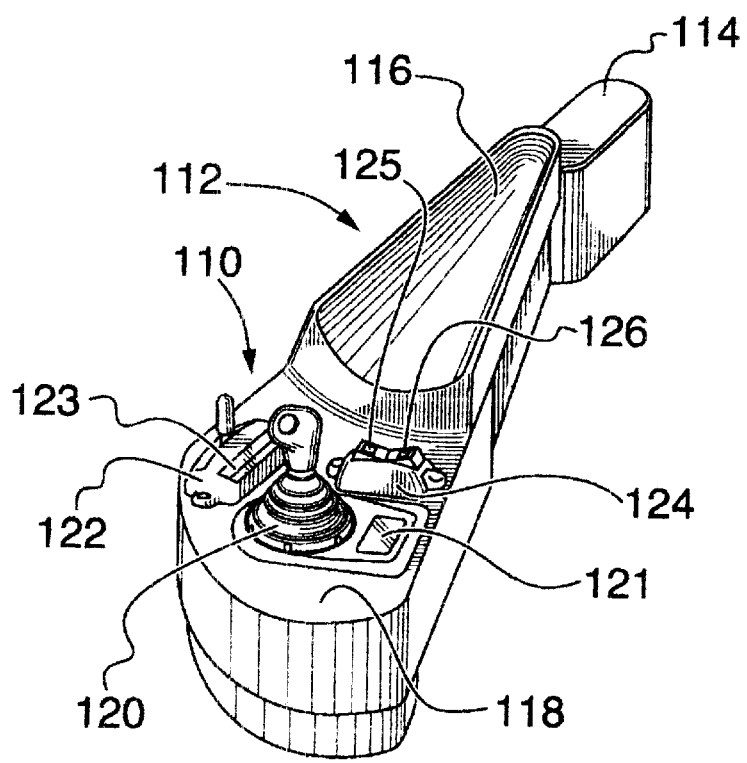
FIG. 2 is a front perspective view of an embodiment of the intrinsic console of the invention.
Figure 3:
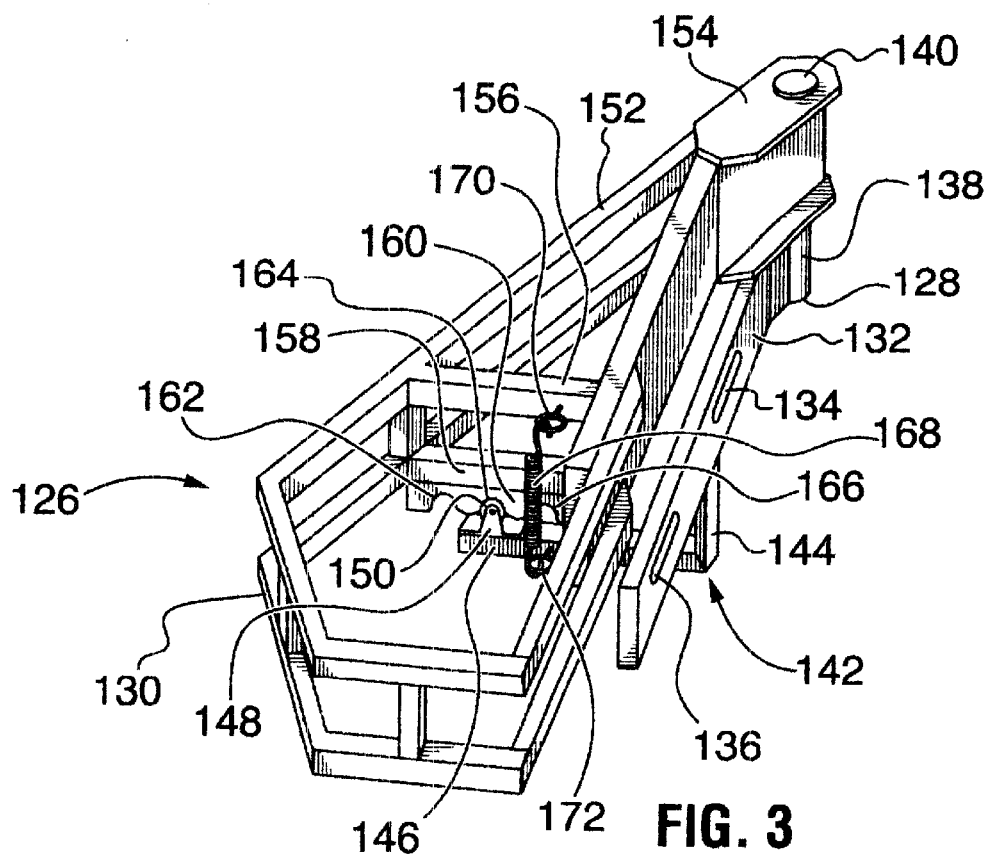
FIG. 3 is an internal perspective view of the embodiment of FIG. 2.

The invention is now illustrated by reference to the drawings. Numeral 10 designates an intrinsic console, which is a primitive prototype, has armrest 12 pivoting about post 14 mounted in base 18 and passing through aperture 16 of armrest 12. Armrest 12 has terminal controller (switch) 20 which has bat 22 movable between two positions ON and OFF. This controller has two associated microswitches 24 and 26 which are position sensors (locators) for the controller bat. Armrest 12 has a terminal transverse bottom wheel (not shown) resting on base 18, which has two radial zones 28 and 30, on the dividing line between these is microswitch 32, which registers movement of armrest 12 from zone 28 to zone 30, but does not identify the direction of movement. Microswitch 34 registers the presence of armrest 12 in contact with it, microswitch 36 also registers armrest 12 in contact with it. Intrinsic console 10 is initially activated by armrest 12 activating either microswitch 34 or 36. All five microswitches are microprocessor (computer) linked. Activation of either microswitch 34 or 36 automatically gives the microprocessor the initial location of armrest in zone 28 or 30. When the armrest passes microswitch 32, the microprocessor registers that armrest's 12 location has changed. Solenoid 38 pushes or pulls the bat of the controller bat to the OFF or ON position depending on the microprocessor's instructions. The controller controls two devices, in zone 28 armrest 12 can send one of two signals to a first device, (ON or OFF), in zone 30 armrest 12 can send one of two signals to a second device (ON or OFF). It should be noted that when the zone is changed say from 28 to 30, the microprocessor remembers the bat position in zone 28 and continues to send the signal to the device. When zones are changed, activating microswitch 32 say from 30 to 28, the microprocessor remembers the bat position, say OFF in zone 28, and instructs the solenoid to move the bat to the OFF position. Solenoid 38 is microprocessor controlled, however it does not resist when the operator changes the bat position.

Numeral 110 indicates another embodiment of the invention, wooden cover 112 has rear pivot cover 114, arm hollow 116, and control surface 118. Cover 112 can be made of any suitable conventional material as would be understood by those skilled in the art. Mounted in control surface 118 are joystick 120 with programmable LCD icon display 121, slider 122 with programmable LCD icon display 123, and toggle 124 with programmable LCD icon displays 125 and 127. Underneath cover 112 and supporting it is aluminum structure 126 which has lower fixed portion 128 and upper pivotable portion 130. Lower portion 128 has attachment plate 132 with attachment slots 134 and 136 for conventional bolting or screwing to a chair or seat. Pivot support 138 is attached to plate 132 and supports pivot pin 140. L shaped arm 142 has vertical section 144 and horizontal section 146, on which bracket 148 holds roller 150. Upper portion 130 has frame 152 including pivot portion 154, and transverse bars 156 and 158, below lower bar 158 is indent bar 160, which has downward facing indents 162, 164 and 166 to receive roller 150. Frame 152 and arm 142 are urged together by spring 168 engaging rings 170 and 172.

Figure 4:
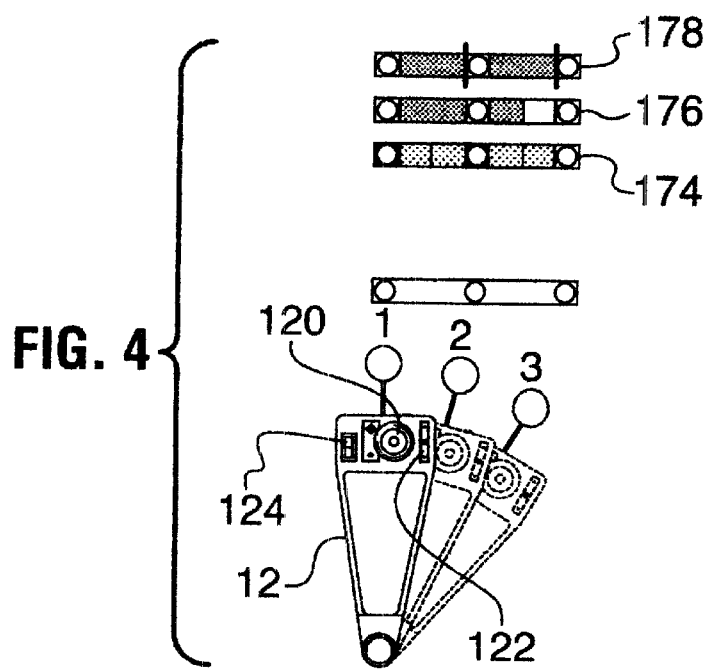
FIG. 4 is a top representation of control function zones corresponding to arm positions of an embodiment of the invention.

FIG. 4 shows armrest 12 (with joystick 120, slider 122 and toggle 124 differently arranged) can be located in three detent positions labelled 1, 2, and 3. Three possible control zone arrangements are shown 174, 176, 178. In arrangement 174 the controls (joystick, slider, toggle) only function when armrest 12 is in a detent position, and in between there are dead zones when the controls do not function. In arrangement 176 the controls change function halfway between defaults. In arrangement 178 the controls change function when the next clockwise default is engaged.

Figure 5:
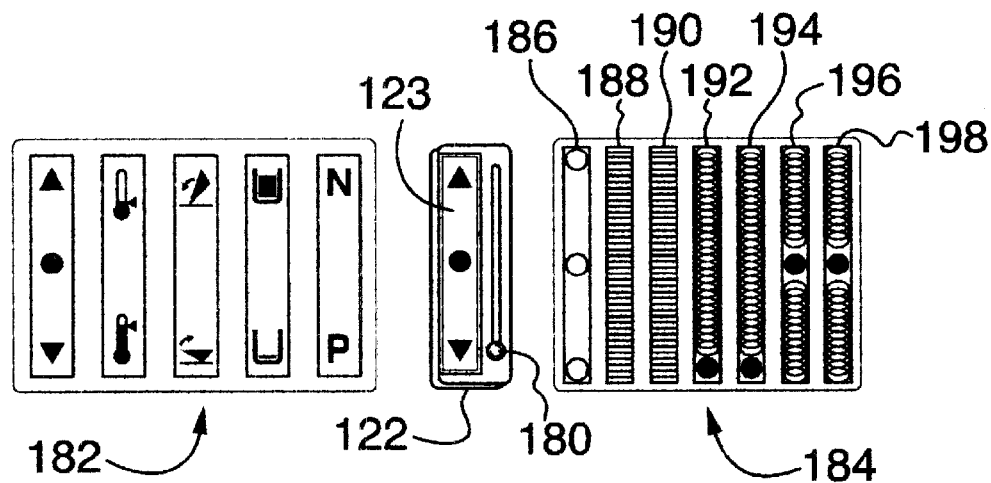
FIGS. 5–7 are representations of switch programmable LCD icon displays and functionalities, slider (FIG. 5), toggle (FIG. 6), and joystick (FIG. 7).
Figure 6:
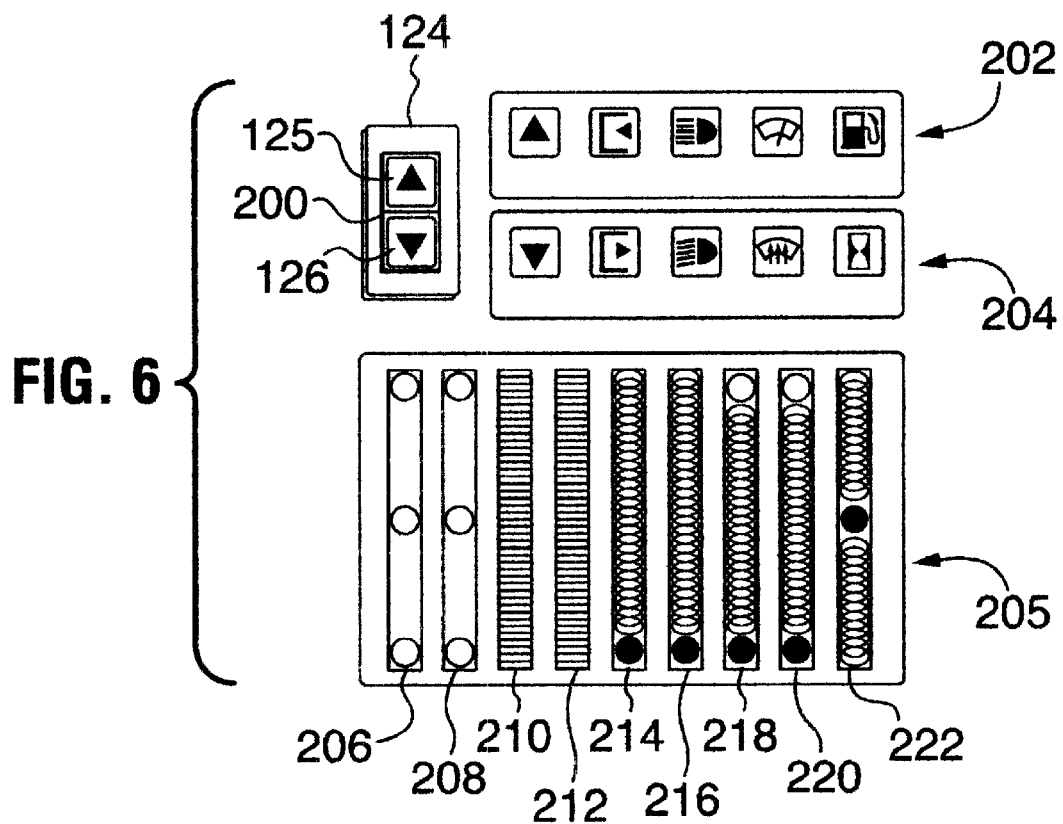

FIG. 5 shows slider 122 with icon displays 182 and functionality types 184. Slider icon displays 182 show what is controlled using conventional or easily recognizable symbols. Illustrative slider functionality types range from triple snap position, 186, through a continuous range of light (slight) 188 and heavy (stiff) 190 resistance to movement, to an end neutral position with light 192 or heavy 194 spring return to rest, to a middle neutral position with spring return to rest with full 198 or limited 196. FIG. 6 shows toggle 124 with icon displays 202 and 204 and functionality types 205.

Figure 7:
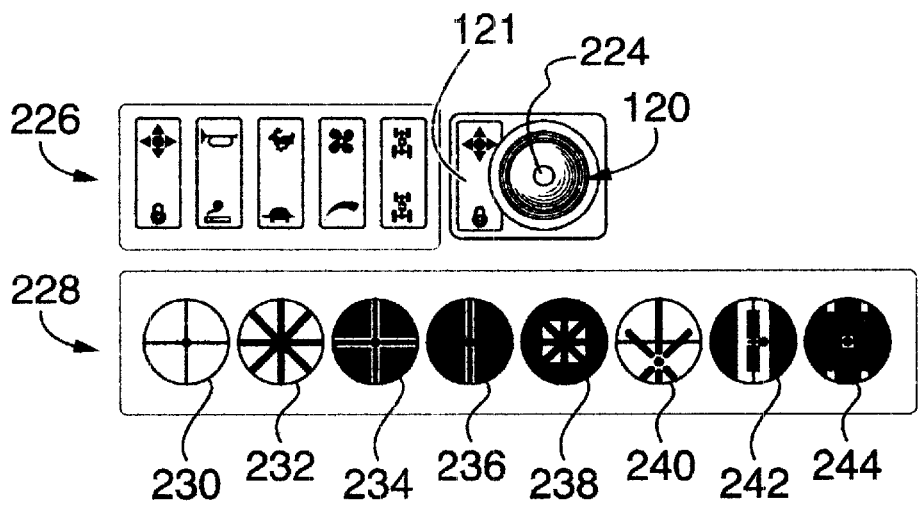

Icon displays 123 and 125 are on toggle rocker 200. Toggle icon displays 202 and 204 show what is controlled using conventional or easily recognizable symbols. Illustrative toggle functionality types 205 range from triple snap position 206 and double snap position 208, through a continuous range of light (slight) 210 and heavy (stiff) 212 resistance to movement, to an end neutral position with light 214 or heavy 216 spring return to rest, or a snap end and opposite end neutral position with light 218 or heavy 220 spring return to rest, or a middle neutral position with spring return to rest with full range 222. FIG. 7 shows joystick 120 with icon displays 226 and functionality types 228. Joystick 120 has icon display 121 and joystick knob 224. Joystick icon displays 226 show what is controlled using conventional or easily recognizable symbols. Illustrative joystick functionality types 205 range from freely positionable 230, freely positionable middle spring return 232, cross middle spring return 234, slider equivalent spring return 236, limited range positionable middle spring return 238, freely positionable offset spring return 240, transmission snap position shifter 242, manual gearshift with snap position and middle spring return 244. As those skilled in the art appreciate these arrangements are illustrative only, numerous variations on the slider and toggle arrangements are possible and these may be combined with interminable variation on the joystick.

Figure 8:
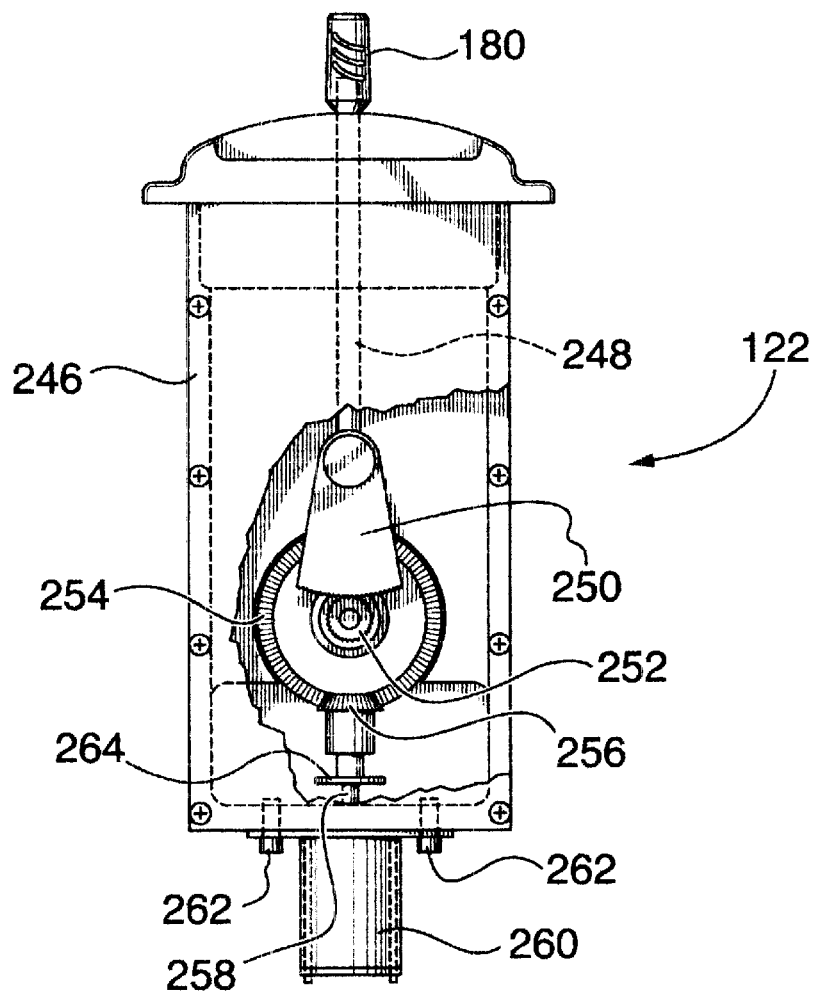
FIG. 8 shows a part sectional elevation of a slider of FIG. 1.
Figure 9:
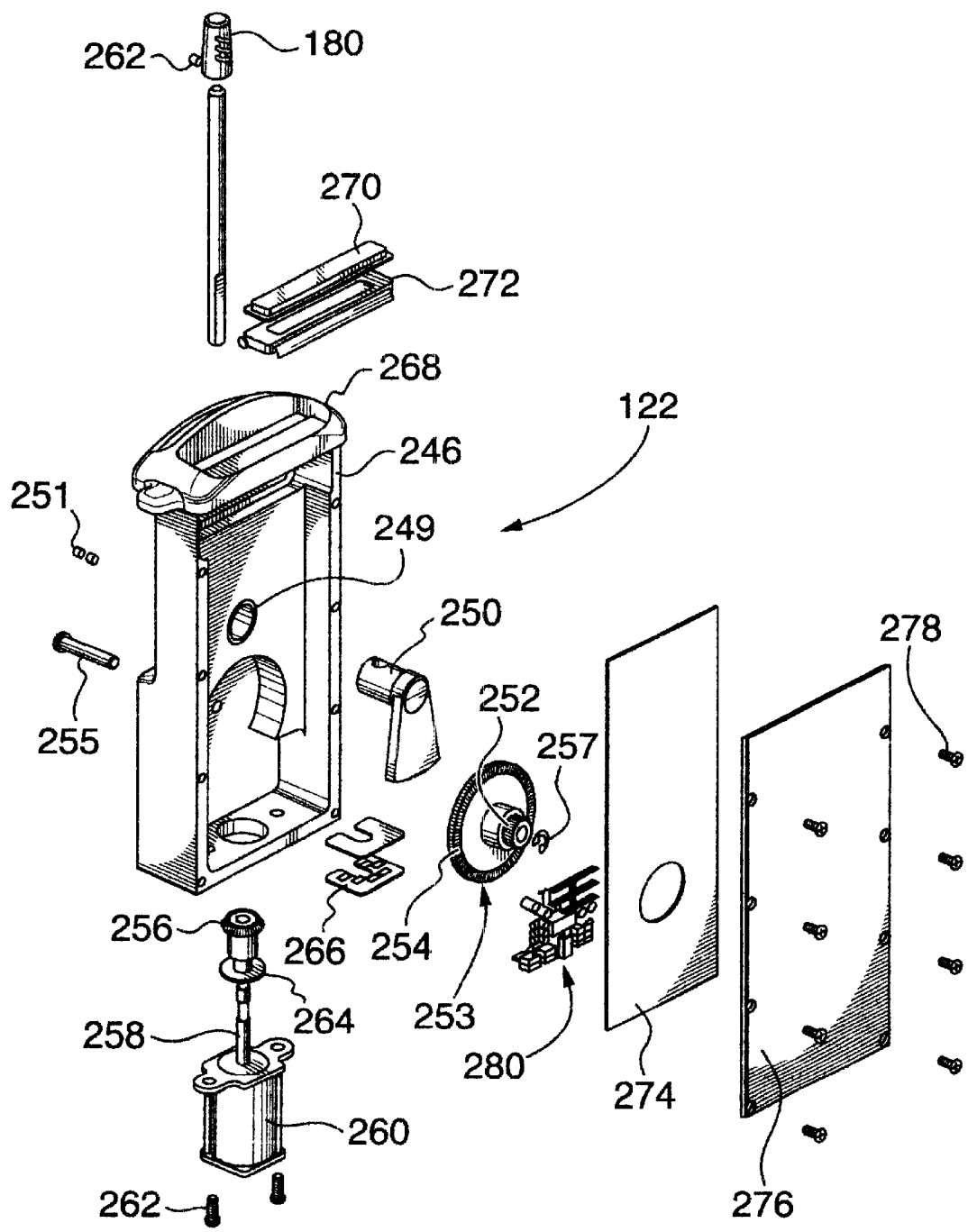
FIG. 9 shows an exploded view of the slider of FIG. 8.

FIGS. 8 and 9 show slider 122 which has case 246, with slider knob 180 mounted by set screw 262 on slider rod 248, which is received in gear segment 250 which is pivotally mounted in recess 249, rod 248 is secured to gear segment 250 by set screws 251. Gear segment 250 meshes with small gear 252 of transmission gear 253, which is mounted on pivot shaft 255 on which it is held by retainer ring 257. Large gear 254 of transmission gear 253 meshes with bevel gear 256 mounted on shaft 258 of brushless DC motor 260 secured by screws 262 to body 246. On shaft 258 is optical positioning disc 264, whose position is measured by sensor, encoder 266 (phototransistor). Slider 122 also has cover 268 in which are LCD cover 270 and LCD display 272. Circuit board 274 contains a controller card for motor 260 and a display card for LCD display 272, which is mounted inside case cover 276, secured to case 246 by screws 278, numeral 280 indicates chips and the like on circuit board 274.

Figure 10:
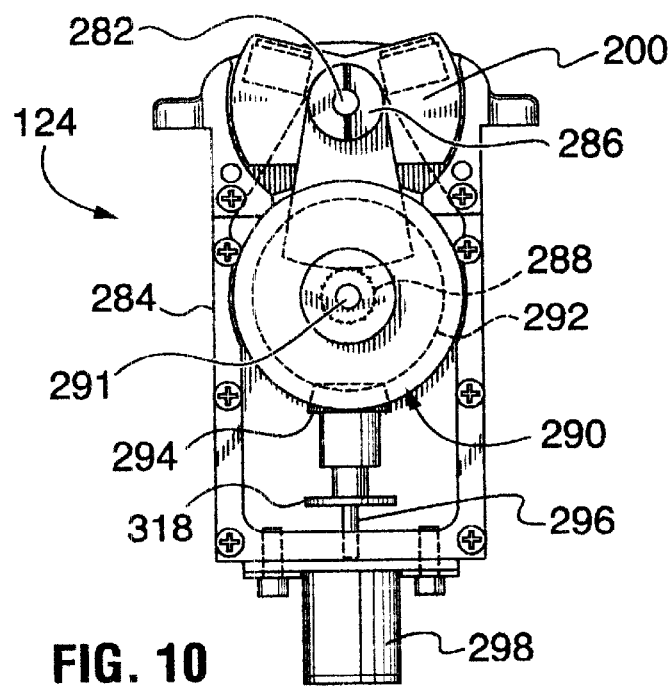
FIG. 10 shows a part sectional elevation of a toggle of FIG. 1.
Figure 11:
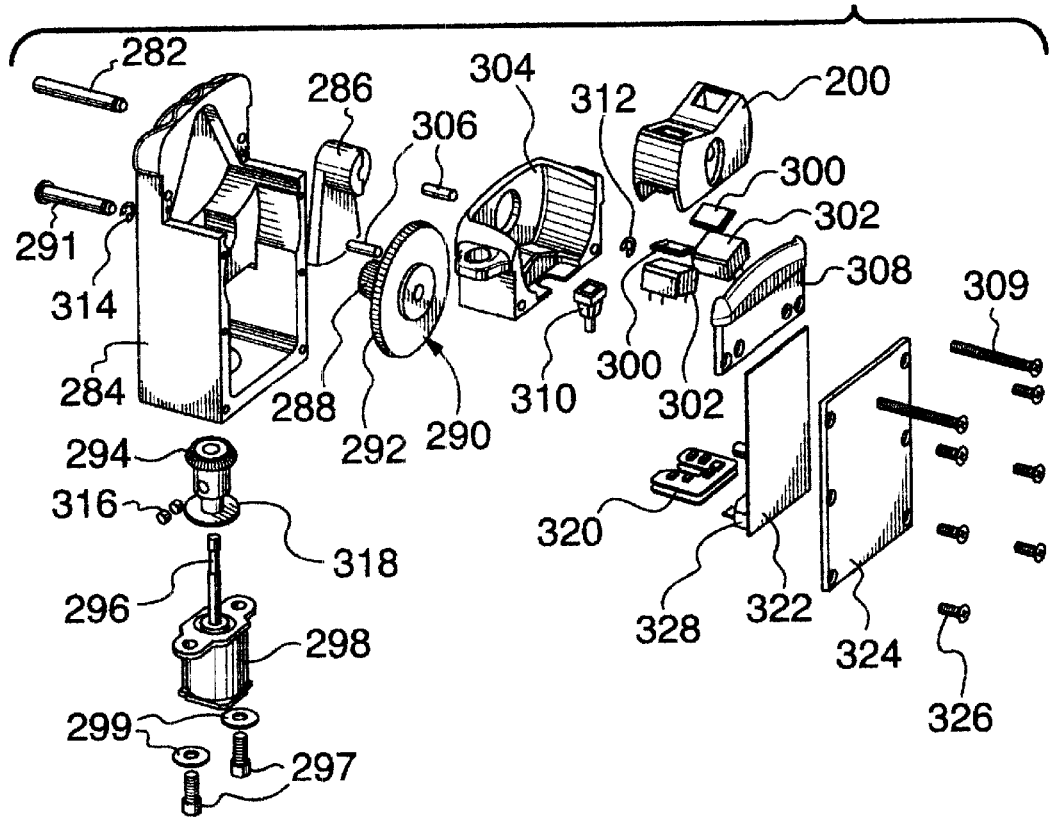
FIG. 11 shows an exploded view of the toggle of FIG. 10.

FIGS. 10 and 11 show toggle 124, which has rocker 200 in case 284 pivotally mounted on upper rocker shaft 282, as is gear sector 286 which engages small gear 288 of transmission gear 290, which is pivotally mounted on lower rocker shaft 291. Large gear 292 of transmission gear 290 engages bevel gear 294 mounted on shaft 296 of motor 298, which is attached to case 284 by screws 297 and washers 299. Preferably rocker 200 has LCD covers 300 mounted therein over small LCD displays 302. Rocker 200 is seated in rocker block 304 and rocker cover 308 which are held in place by dowels 306 and rocker grommet 310. Screws 309 secure rocker cover 308 to case 284. Gear sector 286 is held on upper rocker shaft 282 by retainer ring 312, similarly transmission gear 290 is held on lower rocker shaft 291, by retainer ring 314. Bevel gear 294 is secured to shaft 296 by set screws 316. Optical positioning disc 318 is read by sensor, encoder (phototransistor) 320. Circuit board 322 contains a controller card for motor 298 and a display card for LCD displays 302, which is mounted inside case cover 324 secured to case 284 by screws 326, numeral 328 indicates chips and the like on circuit board 322.

Figure 12:
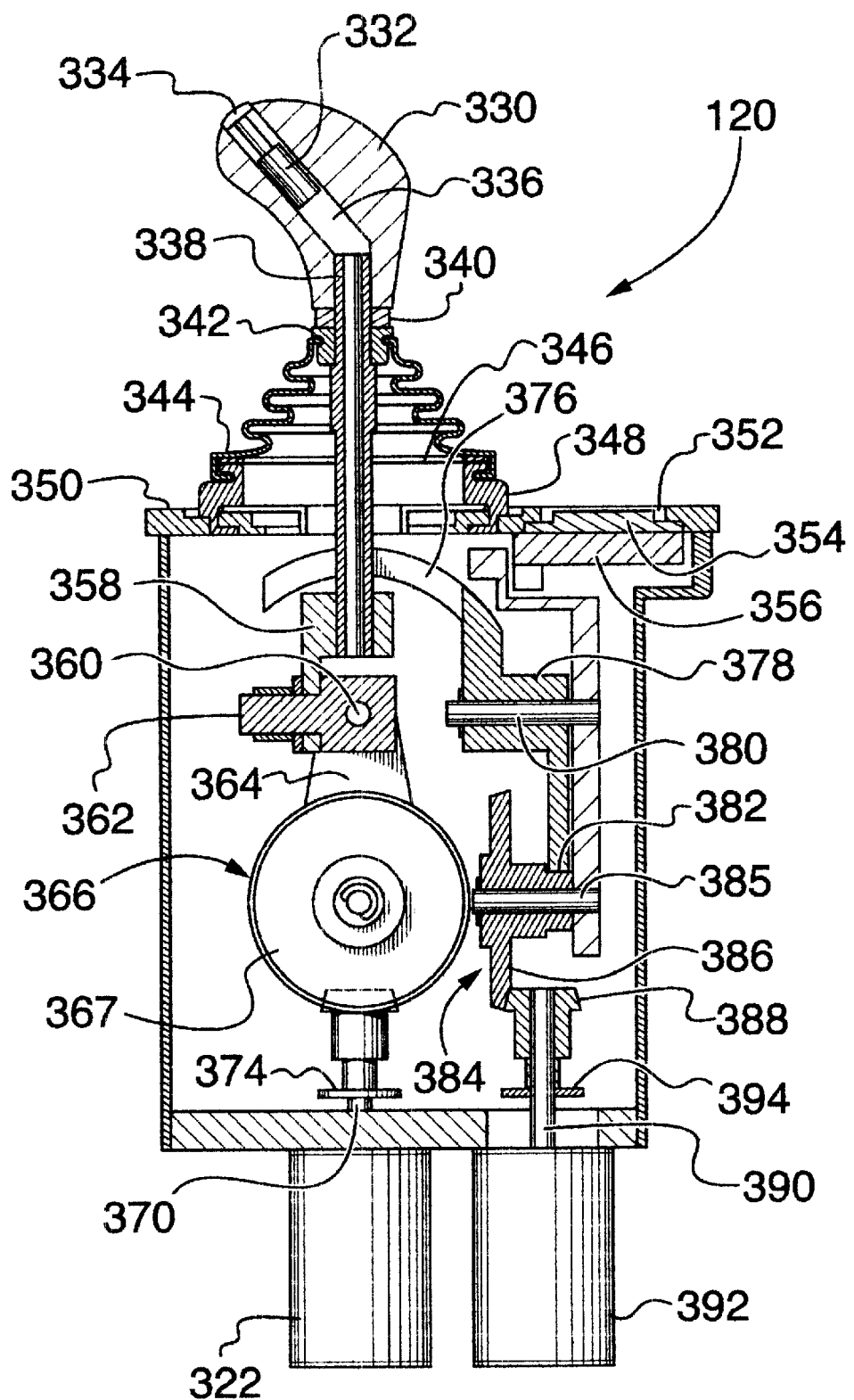
FIG. 12 shows a part sectional elevation of a joystick of FIG. 1.
Figure 13:
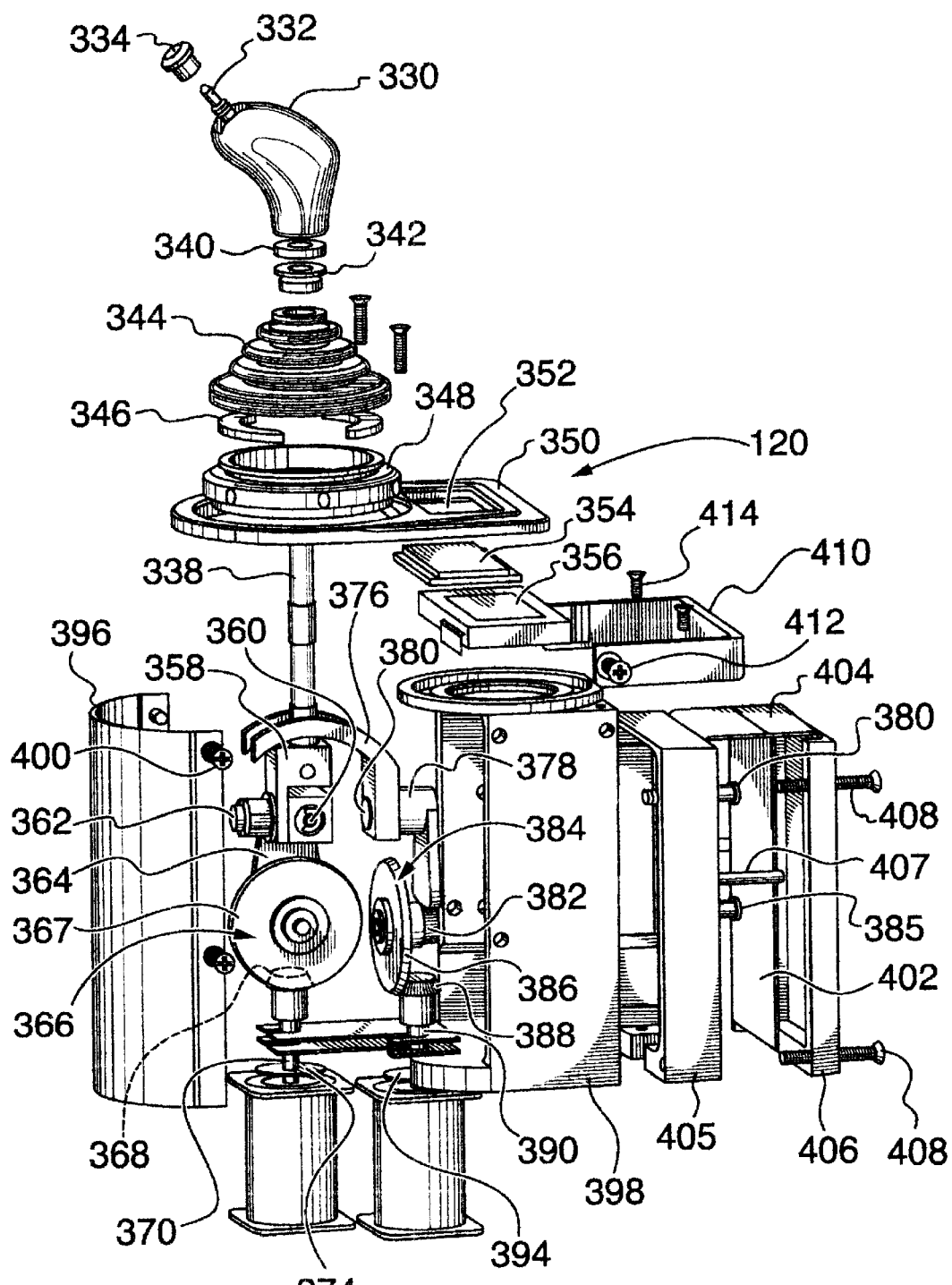
FIG. 13 shows an exploded view of the joystick of FIG. 12.

FIGS. 12 and 13 show joystick 120. Joystick handle 330 has tube 336 in which is joystick push button 332 and joystick push button cover 334. Joystick handle 330 fits onto joystick shaft or rod 338, shaft ring lock 340 and shaft bushing 342 join handle 330 to flexible joystick boot 344 which sits on boot ring lock 346 and boot ring 348, which may be independently rotatable of shaft 338. Boot ring 338 rests on top plate 350, which has LCD aperture 352 beneath which are LCD cover 354 and LCD display 356. Shaft 338 is directly attached to block 358 which may pivot about lower joystick shaft 360 and lower joystick shaft 362. When it pivots about shaft 360 so does sector gear 364 engaging small gear (not shown) of transmission gear 366, large gear 367 engages bevel gear 368 on shaft 370 of brushless DC motor 372, optical positioning disc 374 is on shaft 370. When shaft 338 pivots about shaft 362, it moves yoke 376 and thus sector gear 378 about shaft 380 engaging small gear 382 of transmission gear 384 mounted on shaft 385. Large gear 386 of transmission gear 384 engages bevel gear of 388 of shaft 390 of motor 392, optical positioning disc 394 is mounted on shaft 390. Position sensors (emitters and detectors), not shown are mounted to exactly locate the rotational positions of optical positioning discs 374 and 394. Round plate 396 is joined to joystick base 398 by screws 400. Circuit boards 402 (motor control) and 404 (LCD display) suitably mounted within side plate 405 and side cover 406, secured to base 398 by dowels 407 and screws 408. LCD cover plate 410 is secured by screws 412 and 414.

FIG. 14 shows a circuit where control is supplied by computer or microprocessor 416 through 25 pin cable 418, and power is supplied by 12 volt battery 420 by cable 422 to circuit board 424 which may be one or two cards, including motor controller 426 and display controller 428. Motor controller 426 supplies power through three wire supply 430 to brushless DC motor 432. Display controller 428 controls one or more LCD displays 436 through wires 434. Motor position is monitored and controlled through motor controller 426. Mounted on shaft 438 is optical positioning disc 440, with quadrature holes 442 and commutation slots 444, monitored by sensor/encoder 446 which has infrared emitters 448 and detectors 450. Encoder 446 converts rotational position to digital signal, quadrature measurement gives relative position, commutation measurement gives absolute position.

FIG. 15 similarly shows registration of armrest 12 position, a linear or curved array of quadrature holes 452 and commutation slots 453 are present within armrest 12, also within armrest 12 are infrared emitters 456 and detectors 454 connected to computer 416. Either emitters and detectors are fixed and holes and slots move with armrest 12, or holes and slots are fixed and emitters and detectors move with armrest 12. Either way the exact location of armrest 12 is known.

FIG. 16 illustrates a sample of the variety of toggle rockers which may be used in the controller.

All computer joysticks tell a computer where the handle is positioned at a given moment, by providing x-y axis coordinates of the handle, conventionally the x axis is side to side, the y axis forward and backward at 90° to the x axis. The base of the handle is connected to a pivoting yoke allowing the handle to move freely in any direction. Instant slider and toggle are the same as the joystick except they can move freely only on one axis. Position sensors attached to each axis of joystick, slider and toggle respond to the axis coordinates and send signals to the axis controller that the software uses to interpret the position of the joystick, slider or toggle. The 25 pin parallel port can handle 4 axis controllers 15 displays and the arm. Generally a discharging variable resistor potentiometer-capacitor, an analogue system, is used to estimate joystick position. Instant invention uses a digital system, a non-contact optic sensor generating a digital signal, because nalogue is not accurate enough. Optical quadrature sensors are used which count each hole in the optical positioning disc four times, and also commutation control on the brushless DC motors. Although the devices employ force feed back, there is no time factor, the main factor is position which generates force, with the force depending on function in both senses, mathematical relationship, and task controlled. It was found that for effective position control normal electrical servomotors were insufficient, because of their inertia (moment of rotation) they did not react quickly enough to feed back. The brushless DC motors used have very low inertia sufficient for quick response. A typical long reasonably slender brushless DC motor is used, with magnets on the rotating shaft (armature) and surrounding stationary coils, and no commutator. Brushless makes the motor reliable for a long period. Since motor only does a few revolutions over the entire stroke, any commutator will not self clean by wiping action, also since the motor tends to hunt by the way it's controlled, any commutator may arc. Experiment has showed the motor must be slender for low inertia, so the armature can accelerate and decelerate under reasonably low torque. High armature inertia requires lots of power and time to get spinning, and lots of power and time to stop spinning, and cannot respond quickly. Since the motor must be slender to minimise inertia, it must be long to generate adequate power, which adds torque and inertia, but less inertia than extra width. The motor should be 100% sealed for durability. The shaft should have an adequate diameter to attach gears and encoders. The casing should be machined for a pilot to centre the motor and should have adequate mounting bosses. The shaft should have a flat spot for aft registration of preferably non-adjustable, properly registered gears and tight enough tolerances for back lash. The motor should be assemblable, and disassemblable without special tools. Its wires should be of adequate gauge for easy attachment without breakage, as thin wires are mechanically weak. The motor itself should be removable from outside by two adequately sized screws, bevel gears should remain in position on the motor shaft. Motor wires should be attached to a terminal block, thus avoiding removal stripping. The bevel gear-transmission gear reduces motor rpm substantially. The gears themselves should be durable, light duty, non-lubricated, slippery plastic, for instance Delrin, nylon or Teflon, amongst others, with adequate sized teeth allowing durable, smooth, and reliable operation, registration error without skipping teeth during rotation, and reasonable wear without skipping teeth. Minimal internal airspace is required to maximise internal space utilisation, minimise internal air space and minimise external size.

The embodiment of FIG. 1 worked satisfactorily as a slider; a three-position on switch, (such as a three speed motor in a windshield wiper); a three-position (momentary on) on on switch; a three-position on on (momentary on) switch; a three-position (momentary on) on (momentary on) switch; a two-position on on switch; a two-position on (momentary on) switch; and a resistant position, where the switch bat can be moved anywhere desired and then fights further movement with full motor power. As those skilled in the art appreciate any active switch position (ON) can be replaced with an inactive switch position (OFF). The switch bat or lever can also be positioned, in the then version there are up to 33 programmable distinct positions in an arc of about 400, but as those skilled in the art would appreciate the number of positions can be greatly increased effectively limited by sensor position measurement error or motor position control error, whichever is larger. The switch setting is selectable (and changeable) by connecting the motor microprocessor to a parallel printer port on a PC and selecting a setting from menu. Disconnection leaves the switch setting in place.

As those skilled in the art would realise these preferred described details and materials and components can be subjected to substantial variation, modification, change, alteration, and substitution without affecting or modifying the function of the described embodiments.

Although embodiments of the invention have been described above, it is not limited thereto, and it will be apparent to persons skilled in the art that numerous modifications and variations form part of the present invention insofar as they do not depart from the spirit, nature and scope of the claimed and described invention.

I claim:

1. An intrinsic console mounted on a base and movable between at least two distinct locations comprising at least one input controller, the at least one input controller mounted on the consol for controlling different electrical devices, the different electrical devices being controlled in dependence on the location of the intrinsic console and in dependence on the position of the at least one input controller.

2. Console of claim 1, wherein said controller's position is controlled by microprocessor.

3. Console of claim 2, wherein said controller has a display indicating device controlled by said controller according to controller position in each console location, said display being controlled by microprocessor.

4. Console of claim 1, wherein said console location and controller position are monitored by sensors.

5. Console of claim 4, wherein the relative position of said console is determined by digital optical detectors receiving radiation from electromagnetic emitters passed through an apertured optical positioning member.

6. Console of claim 1, wherein said controller has a different number of control positions in different console locations.

7. Console of claim 6, wherein said controller is selected from toggle switch, slider, rotary switch, and joystick.

8. Intrinsic console of claim 1, wherein said input controller for a device comprises a lever and a microprocessor controlling a motor and the number of positions of said lever.

9. Intrinsic console of claim 8, wherein the positions of said input controller lever are monitored by sensors.

10. Intrinsic console of claim 9, wherein the relative position of said input controller lever is determined by digital optical detectors receiving radiation from electromagnetic emitters passed through an apertured optical positioning member.

11. Intrinsic console of claim 10, wherein the absolute position of said input controller lever is determined by digital optical detectors receiving radiation from electromagnetic emitters passed through commutation slots.

12. Intrinsic console of claim 8, wherein said input controller lever operates as a slider.

13. Intrinsic console of claim 8, wherein said input controller lever operates as a toggle switch.

14. Intrinsic console of claim 13, wherein said toggle switch has a plurality of distinct position settings, each position setting having at least two toggle positions.

15. Intrinsic console of claim 8, where said input controller lever is selected by said microprocessor to function as one of a slider or as a toggle switch, when said toggle switch is selected, a position setting is selected from a plurality of distinct position settings, each position setting having at least two toggle positions.

16. Intrinsic console of claim 1 wherein said input controller comprises a microprocessor controlled motor driving a gear train pivoting a control element.

17. Intrinsic console of claim 16 wherein said control element is a pivotable toggle having at least two control positions.

18. Intrinsic console of claim 16 wherein said control element is a pivotable slider lever.

19. Intrinsic console of claim 16 wherein said input controller comprises two microprocessor controlled motors driving separate gear trains pivoting a control element, each motor and gear train moving said control element in one of two perpendicular dimensions.

20. Intrinsic console of claim 19, wherein said control element is a joystick, wherein the position of the joystick handle is separately determined for each perpendicular dimension is determined by digital optical detectors receiving radiation from electromagnetic emitters passed through an apertured optical positioning member.

* * * * *